United States Patent
Putnik et al.

(10) Patent No.: US 12,312,236 B2
(45) Date of Patent: May 27, 2025

(54) ELECTRODE ARRANGEMENT FOR A MICRO-ELECTRO-MECHANICAL SYSTEM INCLUDING TAPERED ELECTRODE STRUCTURES

(71) Applicant: Robert Bosch GmbH, Stuttgart (DE)

(72) Inventors: Martin Putnik, Rottenburg Am Neckar (DE); Stefano Cardanobile, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1086 days.

(21) Appl. No.: 15/734,903

(22) PCT Filed: Jun. 25, 2019

(86) PCT No.: PCT/EP2019/066918
§ 371 (c)(1),
(2) Date: Dec. 3, 2020

(87) PCT Pub. No.: WO2020/002382
PCT Pub. Date: Jan. 2, 2020

(65) Prior Publication Data
US 2021/0221673 A1    Jul. 22, 2021

(30) Foreign Application Priority Data
Jun. 27, 2018   (DE) .......... 102018210487.5

(51) Int. Cl.
*B81B 3/00*   (2006.01)
*G01C 19/5733*   (2012.01)

(52) U.S. Cl.
CPC .......... *B81B 3/0086* (2013.01); *B81B 3/0021* (2013.01); *G01C 19/5733* (2013.01);
(Continued)

(58) Field of Classification Search
CPC ............... B81B 3/0086; B81B 3/0021; B81B 2201/0242; B81B 2203/0136;
(Continued)

(56) References Cited

U.S. PATENT DOCUMENTS 5,563,343 A * 10/1996 Shaw .................. G01P 15/0802
   73/514.24
6,307,298 B1 * 10/2001 O'Brien ................. H02N 1/008
   310/309

(Continued)

FOREIGN PATENT DOCUMENTS

CN           104326434 A       2/2015
DE       102007033002 A1       1/2009
(Continued)

OTHER PUBLICATIONS

Rosa, et al.: "Enhanced electostatic force generaton capability of angled comb finger design used in elecrostatic comb-drive actuatiors", Electronics Letters, IEE Stevenage, 34 (18), (1998, pp. 1787-1788, XP006010262.

(Continued)

*Primary Examiner* — Ida M Soward
(74) *Attorney, Agent, or Firm* — NORTON ROSE FULBRIGHT US LLP

(57) ABSTRACT

An electrode configuration for a microelectromechanical system, including a first electrode structure and a second electrode structure. The first electrode structure has a receptacle, and the second electrode structure has a finger. The first and second electrode structure are designed for a relative movement in relation to one another along a movement axis. A first width of the receptacle, perpendicular to the movement axis, tapers along the movement axis at least in a first region, and/or a second width of the finger,
(Continued)

perpendicular to the movement axis, tapers along the movement axis at least in a second region.

11 Claims, 3 Drawing Sheets

(52) U.S. Cl.
CPC ... *B81B 2201/02* (2013.01); *B81B 2201/0242* (2013.01); *B81B 2201/033* (2013.01); *B81B 2201/038* (2013.01); *B81B 2203/0136* (2013.01); *B81B 2203/04* (2013.01)

(58) Field of Classification Search
CPC ............ B81B 2203/04; B81B 2201/02; B81B 2201/033; B81B 2201/038; G01C 19/5733
See application file for complete search history.

(56) References Cited

U.S. PATENT DOCUMENTS

| | | | | |
|---|---|---|---|---|
| 8,991,252 | B2* | 3/2015 | Narita | G01C 19/5747 73/514.32 |
| 9,239,222 | B2* | 1/2016 | Narita | G01B 7/14 |
| 10,770,637 | B2* | 9/2020 | Park | H10N 15/10 |
| 2001/0013253 | A1* | 8/2001 | Hashimoto | G01C 19/5719 73/504.12 |
| 2006/0213268 | A1 | 9/2006 | Asami et al. | |
| 2009/0152980 | A1 | 6/2009 | Huang | |
| 2010/0181944 | A1 | 7/2010 | Bauer et al. | |
| 2011/0050251 | A1 | 3/2011 | Franke et al. | |
| 2011/0138931 | A1* | 6/2011 | Hashiguchi | G01P 15/097 73/862.59 |
| 2011/0214709 | A1* | 9/2011 | Evelsizer | H10F 77/1437 257/E31.124 |
| 2012/0293907 | A1* | 11/2012 | Jin | G01C 19/5755 361/280 |
| 2015/0234176 | A1* | 8/2015 | Zhou | G06F 16/958 359/221.2 |
| 2016/0079884 | A1* | 3/2016 | Lange | B81B 3/0086 310/300 |
| 2016/0101975 | A1* | 4/2016 | Ono | B81B 3/0056 257/419 |
| 2016/0268927 | A1* | 9/2016 | Liu | H02N 1/008 |
| 2017/0190568 | A1* | 7/2017 | Morabito | B81B 3/0051 |
| 2017/0190569 | A1* | 7/2017 | Liu | B81B 3/0051 |
| 2017/0341928 | A1* | 11/2017 | Liu | H02N 1/008 |
| 2017/0373611 | A1* | 12/2017 | Cottone | H02N 1/08 |
| 2018/0076740 | A1* | 3/2018 | Liu | B81B 3/0062 |

FOREIGN PATENT DOCUMENTS

| | | | | |
|---|---|---|---|---|
| DE | 102008019049 | A1 | 10/2009 | |
| DE | 102009028924 | A1 | 3/2011 | |
| DE | 102010005596 | A1 | 7/2011 | |
| EP | 2743639 | A1 | 6/2014 | |
| EP | 2749841 | A1 * | 7/2014 | ......... G01C 19/5747 |
| EP | 2749841 | B1 | 12/2016 | |
| JP | 2004233088 | A * | 8/2004 | ............. G01C 19/56 |
| KR | 20180040613 | A * | 4/2018 | ............. G01P 15/131 |
| WO | WO-2009010354 | A2 * | 1/2009 | ........... B81B 3/0094 |
| WO | WO-2013021467 | A1 * | 2/2013 | ........... B81B 3/0086 |

OTHER PUBLICATIONS

Ye, et al.: "Optimal Shape Design of an Electrostatic Comb Drive in Microelectomechancal Systems", Journal of Microelectomechanical Systems, 7 (1), (1998), pp. 15-26, XP011034786.

Wenjing Ye et al. "Optimal Shape Design of an Electrostatic Comb Drive in Microelectromechanical Systems" Journal of Microelectromechanical Systems, IEEE Service Center, US, vol. 7, No. 1, Mar. 1, 1998, Retrieved from the Internet on Nov. 25, 2020: https://www.researchgate.net/publication/3328875_Optimal_shape_design_of_an_electrostatic_comb_drive_in_microelectromechanical_systems. 11 Pages.

Rosa M A et al. "Enhanced electrostatic force generation capability of angled comb finger design used in electrostatic comb-drive actuators" Electronics Letters, IEE Stevenage, GB, vol. 34, No. 18, Sep. 3, 1998, 2 Pages.

International Search Report for PCT/EP2019/066918, Issued Sep. 5, 2019.

* cited by examiner

ELECTRODE ARRANGEMENT FOR A MICRO-ELECTRO-MECHANICAL SYSTEM INCLUDING TAPERED ELECTRODE STRUCTURES

FIELD

The present invention relates to an electrode configuration for a microelectromechanical system, including a first electrode structure and a second electrode structure, the first electrode structure having a receptacle, the second electrode structure having a finger, the first and second electrode structure being designed for a relative movement in relation to one another along a movement axis, as well as a microelectromechanical system and a method for operating a microelectromechanical system.

BACKGROUND INFORMATION

Such electrode configurations typically include two comb structures that mesh with one another and are designed to be movable relative to one another, so that the capacitance between the comb structures can change. In most cases, the comb structures are made plane-parallel, in order to achieve a linear relationship between capacitance and immersion depth. To achieve this, the electrical force is constant over the immersion depth. Such comb structures are used in many areas as electrostatic actuators and detectors, for example in micromechanical rotational rate sensors for producing and measuring the drive oscillation.

Many micromechanical systems, or microelectromechanical systems (MEMS), however, have (intrinsic) non-linearities in their oscillations. The drive oscillation of rotational rate sensors frequently includes, for example, a positive (strengthening) non-linearity. In many cases, a (desired) complete reduction of this non-linearity by optimizing the drive structure based on the constructive surface of the sensor is not possible, or is at least very costly.

SUMMARY

An object of the present invention is to efficiently, and/or in a cost-saving manner, reduce non-linearities in microelectromechanical systems, for example for drive oscillations of rotational rate sensors.

An electrode configuration according to an example embodiment of the present invention for a microelectromechanical system, including a first electrode structure and a second electrode structure may have the advantage that with the aid of the geometric design of the finger and/or of the receptacle a reduction of nonlinearities of oscillations can be achieved. According to an example embodiment of the present invention, it is advantageously possible that a first width of the receptacle, perpendicular to the axis of movement, tapers along the movement axis at least in a first region of the receptacle, and/or that a second width of the finger, perpendicular to the movement axis, tapers along the movement axis at least in a second region of the finger. Correspondingly, non-parallel fingers or receptacles can be used. In this way, it is possible for the capacitance curve to be a nonlinear function of the penetration depth (of the finger in the receptacle). In this way, for example nonlinearities in a drive oscillation of a sensor, in particular a rotational rate sensor, can be compensated without having to use additional electrodes for the compensation.

Such advantages cannot be achieved with conventional configurations having parallel fingers or receptacles. In the case of parallel fingers or receptacles, the capacitance is a linear function of the immersion depth of the finger in the receptacle. Correspondingly, with such conventional electrode configurations nonlinearities cannot be compensated, and for example additional compensating electrodes must be used, which requires additional constructive space and can have a correspondingly negative effect on the miniaturization and costs.

According to an example embodiment of the present invention, it is possible that one of the first and second electrode structures is connected immovably to a substrate, and the respective other structure is connected to a movable structure/mass of a microelectromechanical system.

Advantageous developments and specific embodiments of the present invention are described herein.

Due to the fact that the finger is situated at least partly in the receptacle and is movable relative to the receptacle along the movement axis, according to a specific embodiment of the present invention, it is advantageously possible for an immersion depth of the finger in the receptacle to change, which can result in a nonlinear change in capacitance between the first and second electrode structure.

Due to the fact that the first width of the receptacle in the first region tapers in the direction of a second main body of the second electrode structure, and/or that the second width of the finger in the second region tapers along the movement axis in the direction of the second main body, according to a specific embodiment of the present invention it is advantageously possible that negative (weakening) nonlinearities of oscillations are capable of being compensated.

Due to the fact that the first width of the receptacle in the first region tapers along the movement axis in the direction of a first main body of the first electrode structure, and/or that the second width of the finger in the second region tapers along the movement axis in the direction of the first main body, according to a specific embodiment of the present invention it is possible for the positive (strengthening) nonlinearities of an oscillation to be capable of being compensated.

Due to the fact that the first and second electrode structure, and in particular the receptacle and the finger, are designed such that an electrical capacitance between the first and second electrode structure changes in a nonlinear manner during the relative movement, according to a specific embodiment of the present invention it is possible to advantageously omit additional electrode configurations for the compensation of nonlinearities.

Given a particular capacitance curve, the electrical force can be determined as a gradient of the capacitance. Accordingly, given a constant applied voltage, the electrical force is proportional to the derivative of the capacitance according to the movement direction x of the relative movement (along the movement axis) (equation (1)).

$$F_{el}(x) \sim \frac{\partial C(x)}{\partial x} \qquad (1)$$

A tapering of the finger and/or of the receptacle results in a capacitance curve that can be approximated by a corresponding polynomial. In this way, electrical forces can be produced that compensate, e.g., quadratic and cubic nonlinearities of the mechanics (equation (2)).

$$F_{el}(x) \sim \frac{\partial C(x)}{\partial x} = \frac{\partial (ax^4 + bx^3 + cx^2 + dx + e)}{\partial x} = 4ax^3 + 3bx^2 + 2cx + d \qquad (2)$$

Correspondingly, additional nonlinear force terms (of a higher order) can also be produced by the capacitance curve and compensated.

According to a specific embodiment of the present invention, it is possible that tapered structures (fingers and/or receptacles) are integrated into a drive structure and/or detection structure of a MEMS. In this way, it is advantageously possible for the electrical force always to be in phase with the drive oscillation due to the electrostatic positive feedback. In this way, an optimal capacity for compensation can be achieved over a large range of deflection in the microelectromechanical system (e.g. in the rotational rate sensor). In addition, the compensation can be fine-tuned via the positive feedback voltage.

Due to the fact that the first electrode structure has a multiplicity of receptacles, the second electrode structure having a multiplicity of fingers, according to a specific embodiment of the present invention extensive electrode structures can be used that are designed for the optimal driving and/or for the detection of oscillations of a MEMS component. Here, the various fingers and receptacles can each have the same geometrical design. Alternatively, it is also possible to combine receptacles and/or fingers having different geometrical designs in order to achieve the desired properties. For example, some of the additional fingers and/or receptacles may be fashioned in parallel.

A further example embodiment of the present invention is a microelectromechanical system wherein the microelectromechanical system includes an electrode configuration according to a specific embodiment of the present invention.

Due to the fact that the electrode configuration is part of an actuator or detector of the microelectromechanical system, according to a specific embodiment of the present invention it is possible to equip a wide variety of MEMS components with an electrode configuration according to a specific embodiment of the present invention.

A further embodiment of the present invention is a method for operating a microelectromechanical system according to a specific embodiment of the present invention, the first and second electrode structure being designed for relative movement in relation to one another along a movement axis.

Due to the fact that the electrical capacitance between the first and second electrode structure changes in nonlinear fashion during the relative movement, according to a specific embodiment of the present invention it is possible for nonlinearities of an oscillation of the microelectromechanical system to be capable of being compensated, and in particular additional electrodes for compensating nonlinearities can advantageously be omitted.

The microelectromechanical system according to a specific embodiment of the present invention and the method for operating a microelectromechanical system according to a specific embodiment of the present invention may have, in contrast to the related art, the advantages already described in connection with the electrode configuration according to the present invention or a specific embodiment of the electrode configuration according to the present invention.

In contrast to the related art, the electrode configuration according to the present invention may have the advantages already described in connection with the microelectromechanical system according to the present invention, the method according to the present invention for operating a microelectromechanical system, a specific embodiment of the microelectromechanical system according to the present invention, or a specific embodiment of the method according to the present invention for operating a microelectromechanical system.

Exemplary embodiments of the present invention are shown in the figures and are explained in more detail below.

DETAILED DESCRIPTION OF EXAMPLE EMBODIMENTS

Figure 1:
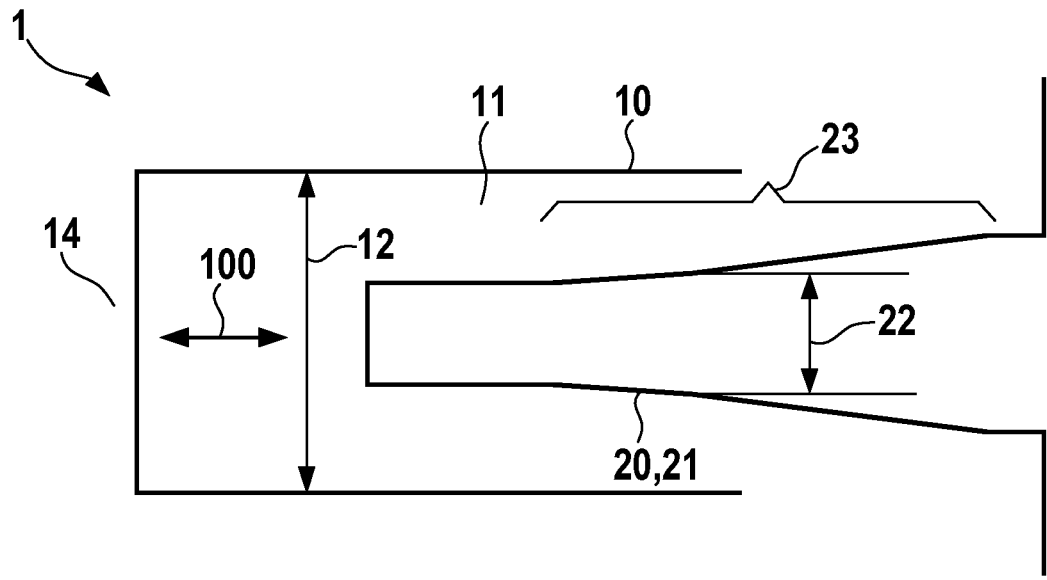
FIG. 1 shows a schematic representation of an electrode system according to a first specific embodiment of the present invention.

In the various Figures, identical parts are provided with the same reference characters, and are therefore generally named or mentioned only once.

FIG. 1 shows a schematic representation of an electrode configuration 1 according to a first specific embodiment of the present invention. Electrode configuration 1 is part of a microelectromechanical system. It includes a first electrode structure 10 and a second electrode structure 20. One of the first and second electrode structures 10, 20 is for example connected fixedly to a substrate, and the other electrode structure 10, 20 is part of an oscillating body that is movable relative to the substrate. Correspondingly, first and second electrode structure 10, 20 can carry out a movement relative to one another along a movement axis 100. During such a relative movement, a finger 21 of second electrode structure 20 can penetrate deeper into a receptacle 11 of first electrode structure 10, or can be moved further out of receptacle 11. It is for example possible that movement axis 100 coincides with the drive movement axis of the microelectromechanical system.

Movement axis 100 is typically made at least substantially parallel to a surface of the substrate. Perpendicular to movement axis 100 (and perpendicular to the substrate surface), receptacle 11 has a first width 12. First width 12 is here constant over the entire extension of first receptacle 11 (along movement axis 100). Finger 21 has a second width 22 perpendicular to movement axis 100 (and parallel to the substrate surface). Over a second region 23 of finger 21, second width 22 of the finger here tapers in the direction of immersion (of the finger) along movement axis 100 and thus in the direction of a first main body 14 of first electrode structure 1. Second region 23 extends well beyond half of the overall extension of finger 21 along movement axis 100. In the remaining part of finger 21, second width 23 of finger 21 remains constant. Various other geometries are also possible; for example, second region 23 could have one or more interruptions in which second width 22 remains constant. Through the tapering of finger 21, the change of the capacitance between first and second electrode structure 10, 20 as a function of the immersion depth (along movement axis 100) is nonlinear. In particular, with the specific embodiment shown in FIG. 1, strengthening nonlinearities of a drive oscillation/detection oscillation can be compensated in this way.

Figure 2:
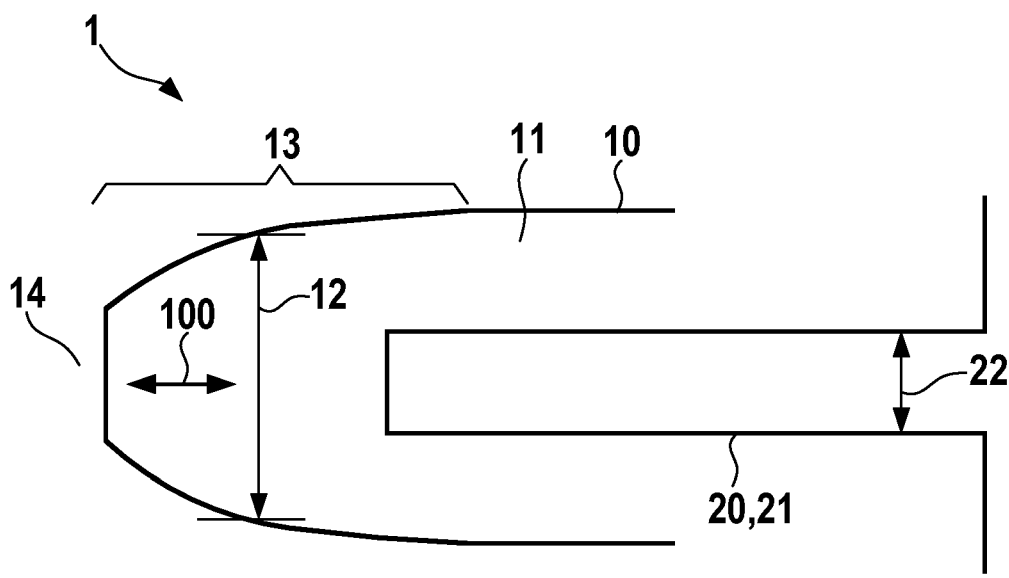
FIG. 2 shows a schematic representation of an electrode configuration according to a second specific embodiment of the present invention.

FIG. 2 shows a schematic representation of an electrode configuration 1 according to a second specific embodiment of the present invention. In contrast to the first specific embodiment (FIG. 1), second width 22 of finger 21 is at least substantially constant over the entire extension of finger 21. In contrast, first width 12 of receptacle 11 tapers in a first region 13 along movement axis 100, in the direction of first main body 14.

Through this tapering of receptacle 11, the change of the capacitance between the first and second electrode structure 10, 20 as a function of the immersion depth (along movement axis 100) is nonlinear. In particular, with the specific embodiment shown in FIG. 2 strengthening nonlinearities of a drive oscillation/detection oscillation can be compensated in this way.

Figure 3:
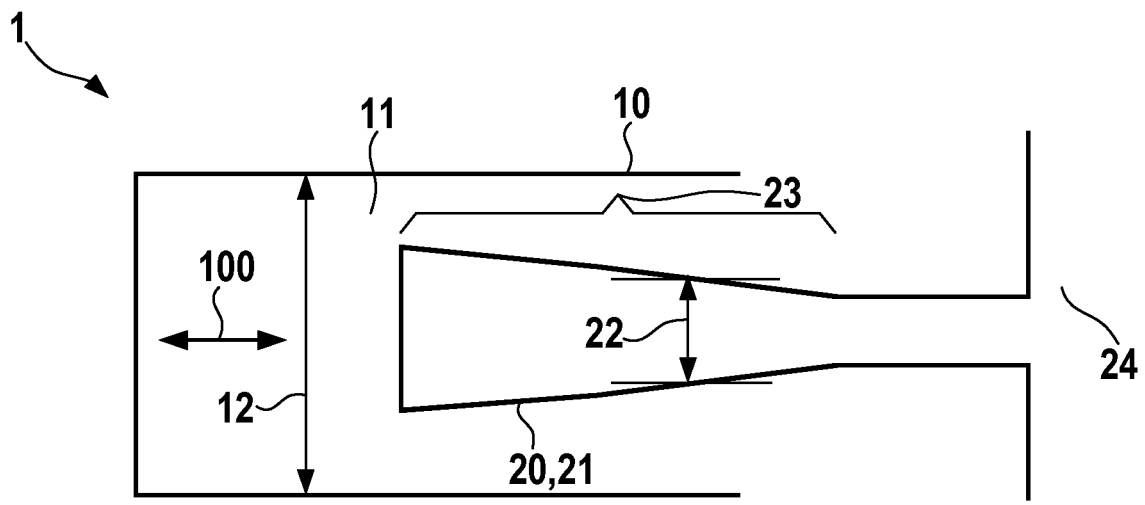
FIG. 3 shows a schematic representation of an electrode configuration according to a third specific embodiment of the present invention.

FIG. 3 shows a schematic representation of an electrode configuration 1 according to a third specific embodiment of the present invention. In the third specific embodiment, second width 22 of finger 21 tapers over second region 23, opposite the immersion direction of finger 21 along movement axis 100. Correspondingly, second width 22 of finger 21 becomes smaller in second region 23 in the direction of second main body 24 of second electrode structure 20. Second region 23 extends well beyond half the overall extension of finger 21 along movement axis 100. In the remaining part, second width 23 of finger 21 remains constant.

Figure 4:
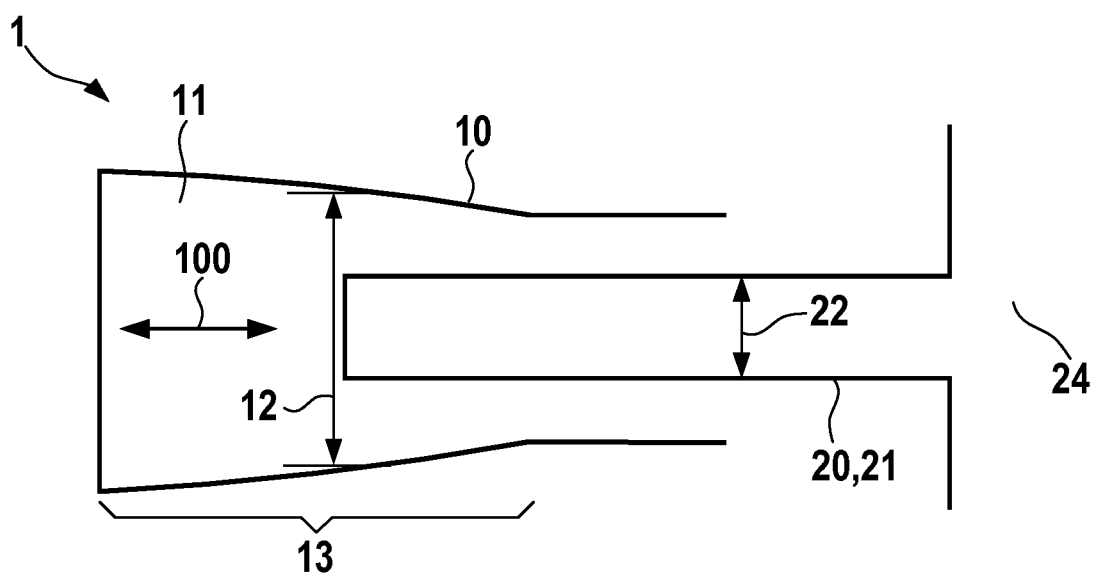
FIG. 4 shows a schematic representation of an electrode configuration according to a fourth specific embodiment of the present invention.

FIG. 4 shows a schematic representation of an electrode configuration 1 according to a fourth specific embodiment of the present invention. In contrast to the third specific embodiment (FIG. 3), second width 22 of finger 21 is at least substantially constant over the entire extension of finger 21. In contrast, first width 12 of receptacle 11 tapers in a first region 13 along movement axis 100, in the direction of second main body 24.

With the specific embodiments shown in FIGS. 3 and 4, weakening (negative) nonlinear effects of a drive oscillation/detection isolation can be compensated in this way. Typically, first electrode structure 10 includes a multiplicity of receptacles 11 that are attached alongside one another on first main body 14 of first electrode structure 10. Correspondingly, second electrode structure 20 includes a multiplicity of fingers 21 that are attached on a second main body 24 of second electrode structure 20 and are each capable of being introduced into a receptacle 11.

Figure 5:
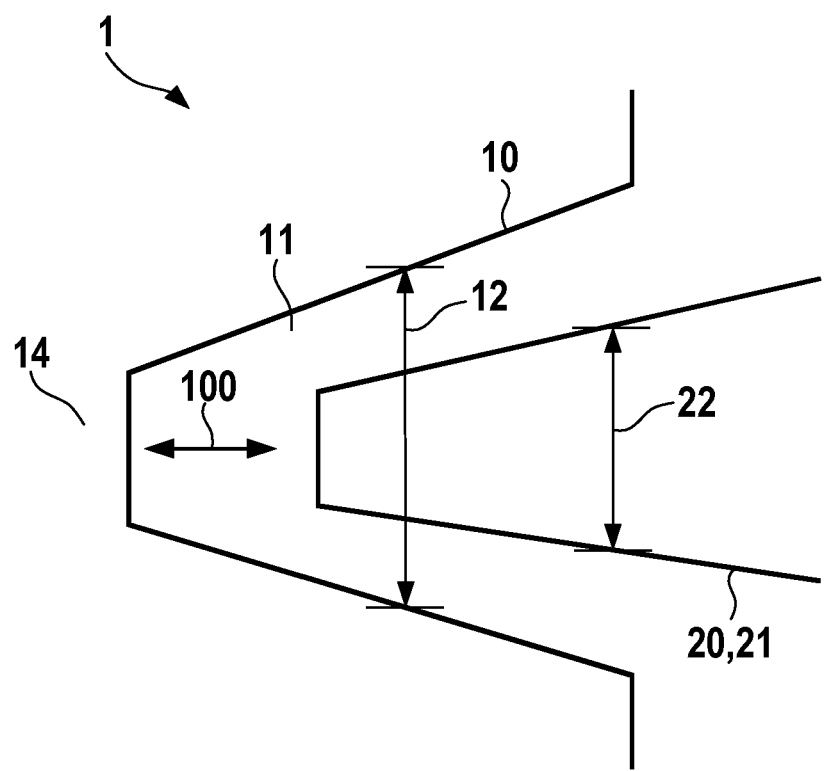
FIG. 5 shows a schematic representation of an electrode configuration according to a fifth specific embodiment of the present invention.

FIG. 5 shows a schematic representation of an electrode configuration 1 according to a fifth specific embodiment of the present invention. As is shown in FIG. 5, fingers 21 and receptacles 11, each of which tapers, can be combined with one another. In this exemplary specific embodiment, first width 12 of receptacle 11 tapers along movement axis 100 in the direction of a first main body 14 of first electrode structure 1 (for example over the entire length of receptacle 11, or, alternatively, only in a first region 13). At the same time, second width 22 of finger 21 tapers in the direction of first main body 14 (for example over the entire length of the finger, or, alternatively, only in a second region 23).

A wide variety of other combinations of fingers 21 and receptacles 11, shown as examples in FIGS. 1 through 5, are also possible.

What is claimed is:

1. An electrode configuration for a microelectromechanical system, comprising:
    a first electrode structure having a receptacle; and
    a second electrode structure having a finger, the first electrode and the second electrode structures being configured for a relative movement in relation to one another along a movement axis;
    wherein a first width of the receptacle, perpendicular to the movement axis, tapers along the movement axis at least in a first region, and a second width of the finger, perpendicular to the movement axis, tapers along the movement axis at least in a second region, wherein the second region extends more than half of an entire extension of the finger along the movement axis.

2. The electrode configuration as recited in claim 1, wherein the finger is situated at least partly in the receptacle and is movable relative to the receptacle along the movement axis.

3. The electrode configuration as recited in claim 1, wherein the first width of the receptacle tapers in the first region in a direction of a second main body of the second electrode structure, and/or the second width of the finger tapers in the second region along the movement axis in the direction of the second main body.

4. The electrode configuration as recited in claim 1, wherein the first width of the receptacle tapers in the first region along the movement axis in a direction of a first main body of the first electrode structure, and/or the second width of the finger tapers in the second region along the movement axis in the direction of the first main body.

5. The electrode configuration as recited in claim 1, wherein the receptacle and the finger are configured such that an electrical capacitance between the first electrode structure and the second electrode structure changes in a nonlinear manner during the relative movement.

6. The electrode configuration as recited in claim 1, wherein the first electrode structure has a multiplicity of receptacles, the second electrode structure has a multiplicity of fingers.

7. A microelectromechanical system, comprising:
    an electrode configuration for a microelectromechanical system, including:
        a first electrode structure having a receptacle; and
        a second electrode structure having a finger, the first electrode and the second electrode structures being configured for a relative movement in relation to one another along a movement axis;
        wherein a first width of the receptacle, perpendicular to the movement axis, tapers along the movement axis at least in a first region, and a second width of the finger, perpendicular to the movement axis, tapers along the movement axis at least in a second region, wherein the second region extends more than half of an entire extension of the finger along the movement axis.

8. The microelectromechanical system as recited in claim 7, wherein the electrode configuration is part of an actuator or detector of the microelectromechanical system.

9. A method for operating a microelectromechanical system, the micromechanical system including an electrode configuration for a microelectromechanical system, including a first electrode structure having a receptacle, and a second electrode structure having a finger, the first electrode and the second electrode structures being configured for a relative movement in relation to one another along a movement axis, wherein a first width of the receptacle, perpendicular to the movement axis, tapers along the movement axis at least in a first region, and a second width of the finger, perpendicular to the movement axis, tapers along the movement axis at least in a second region, wherein the second region extends more than half of an entire extension of the finger along the movement axis, the method comprising:

carry out, by the first and second electrode structures, the relative movement in relation to one another along the movement axis.

10. The method as recited in claim 9, wherein the electrical capacitance between the first electrode structure and second electrode structure changes in a nonlinear manner during the relative movement.

11. The microelectromechanical system as recited in claim 1, wherein the first electrode structure and the second electrode structure are arranged for an electrical capacitance between the first electrode structure and the second electrode structure to change nonlinearly during the relative movement.

* * * * *